United States Patent
Yamazaki

(10) Patent No.: US 9,346,423 B2
(45) Date of Patent: May 24, 2016

(54) CONTROL DEVICE FOR VEHICLE AND METHOD OF CONTROLLING VEHICLE

(71) Applicant: NISSAN MOTOR CO., LTD., Yokohama-shi, Kanagawa (JP)

(72) Inventor: Takehiko Yamazaki, Chigasaki (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/416,512

(22) PCT Filed: Jun. 11, 2013

(86) PCT No.: PCT/JP2013/066116
§ 371 (c)(1),
(2) Date: Jan. 22, 2015

(87) PCT Pub. No.: WO2014/017199
PCT Pub. Date: Jan. 30, 2014

(65) Prior Publication Data
US 2015/0175103 A1    Jun. 25, 2015

(30) Foreign Application Priority Data
Jul. 27, 2012    (JP) .................. 2012-167013

(51) Int. Cl.
*B60R 16/033*    (2006.01)
*B60R 16/02*    (2006.01)
(Continued)

(52) U.S. Cl.
CPC ................ *B60R 16/033* (2013.01); *B60L 1/00* (2013.01); *B60L 3/0092* (2013.01); *B60L 11/02* (2013.01);
(Continued)

(58) Field of Classification Search
CPC .... B60R 16/0133; B60R 16/00; B60R 16/033
See application file for complete search history.

(56) References Cited

U.S. PATENT DOCUMENTS 6,757,599 B2    6/2004    Nada
2001/0048226 A1*    12/2001    Nada .................. F02N 11/0859
290/40 C
(Continued)

FOREIGN PATENT DOCUMENTS

JP    9-287513 A    11/1997
JP    2001-317399 A    11/2001
(Continued)

OTHER PUBLICATIONS

USPTO Office Action, U.S. Appl. No. 14/416,218, Jul. 28, 2015, 15 pages.
(Continued)

*Primary Examiner* — Fadey Jabr
*Assistant Examiner* — Martin Weeks
(74) *Attorney, Agent, or Firm* — Foley & Lardner LLP

(57) ABSTRACT

A control device for a vehicle includes: a motor generator mechanically connected to an output shaft of an engine; a main battery electrically connected to the motor generator; a sub battery electrically connected to an electric load of the vehicle; and a relay adapted to switch whether the batteries are to be electrically connected or not by turning the relay on or off. The relay is turned off during a powering operation of the motor generator, and the relay is turned on during a regenerative operation of the motor generator. It is determined that the relay is off-fixed in a case where a voltage of the second battery is a predetermined voltage or lower or a charge current of the second battery is a predetermined current or smaller in a state that a command to turn on the relay is outputted during the regenerative operation of the motor generator.

2 Claims, 4 Drawing Sheets

(51) Int. Cl.
*B60W 30/18* (2012.01)
*F02N 11/00* (2006.01)
*F02N 11/04* (2006.01)
*F02N 11/08* (2006.01)
*F02N 11/10* (2006.01)
*G01R 31/327* (2006.01)
*B60W 10/26* (2006.01)
*B60L 1/00* (2006.01)
*B60L 3/00* (2006.01)
*B60L 11/02* (2006.01)
*B60L 11/18* (2006.01)
*G01R 31/00* (2006.01)

(52) U.S. Cl.
CPC ......... *B60L 11/1859* (2013.01); *B60L 11/1868* (2013.01); *B60R 16/02* (2013.01); *B60W 10/26* (2013.01); *B60W 30/18127* (2013.01); *F02N 11/006* (2013.01); *F02N 11/04* (2013.01); *F02N 11/087* (2013.01); *F02N 11/0866* (2013.01); *F02N 11/108* (2013.01); *G01R 31/3278* (2013.01); *B60L 2240/547* (2013.01); *B60L 2240/549* (2013.01); *B60L 2260/26* (2013.01); *F02N 2250/02* (2013.01); *G01R 31/006* (2013.01)

(56) References Cited

U.S. PATENT DOCUMENTS

| | | |
|---|---|---|
| 2003/0158639 A1 | 8/2003 | Nada |
| 2005/0061574 A1* | 3/2005 | Torizawa .............. B62D 5/0484 180/421 |
| 2005/0082095 A1 | 4/2005 | Tamai et al. |
| 2005/0269981 A1* | 12/2005 | Sakurai .................... B60K 6/26 318/139 |
| 2006/0097577 A1 | 5/2006 | Kato et al. |
| 2010/0123989 A1 | 5/2010 | Kosaki et al. |
| 2012/0049771 A1 | 3/2012 | Komatsu |
| 2012/0191294 A1 | 7/2012 | Boiron et al. |
| 2013/0106180 A1 | 5/2013 | Akimasa et al. |

FOREIGN PATENT DOCUMENTS

| | | |
|---|---|---|
| JP | 2004-032903 A | 1/2004 |
| JP | 2004-328988 A | 11/2004 |
| JP | 2007-120960 A | 5/2007 |
| JP | 2007-318849 A | 12/2007 |
| JP | 2007-329045 A | 12/2007 |
| JP | 2008-82275 A | 4/2008 |
| JP | 2009-171769 A | 7/2009 |
| JP | 2007-266494 A | 11/2009 |
| JP | 2010-154594 A | 7/2010 |
| JP | 2011-4556 A | 1/2011 |
| JP | 2011-87408 A | 4/2011 |
| JP | 2012-25201 A | 2/2012 |
| WO | WO-2004/071814 A1 | 8/2004 |
| WO | WO-2011/010026 A1 | 1/2011 |
| WO | WO-2012/008124 A1 | 1/2012 |

OTHER PUBLICATIONS

U.S. Appl. No. 14/416,218, filed Jan. 21, 2015, Nissan Motor Co., Ltd.

USPTO Notice of Allowance, U.S. Appl. No. 14/416,218, Nov. 25, 2015, 8 pages.

* cited by examiner

US 9,346,423 B2

CONTROL DEVICE FOR VEHICLE AND METHOD OF CONTROLLING VEHICLE

TECHNICAL FIELD

The present invention relates a control device for a vehicle and a method of controlling a vehicle.

BACKGROUND ART

Heretofore, in a control device for a vehicle capable of automatic stop/automatic restart, a technology in which a main battery electrically connected to a starter, a sub battery electrically connected to an electric load of the vehicle, and a relay capable of switching whether the main battery and the sub battery are to be electrically connected or not by turning on/off the relay are provided and the starter is operated by turning off the relay at the time of restart after automatic stop of an engine (see JP2008-82275A). As a result, at the time of operating the starter, it is possible to prevent a voltage drop (instantaneous voltage drop) of the sub battery from occurring, and this makes it possible to prevent power supply shortage to the electric load. Further, it is also possible to charge the main battery and the sub battery by means of an alternator driven by the engine by turning on the relay.

SUMMARY OF INVENTION

However, in the control device for the vehicle described above, in a case where an off-fixation failure in which the relay between the main battery and the sub battery is kept to be off occurs, a following problem is caused. Namely, in a case where an off-fixation failure has occurred in the relay when a command to turn on the relay is outputted to charge the main battery and the sub battery by means of the alternator, the sub battery cannot be charged and a voltage thereof lowers. For this reason, there is a probability that power supply shortage to an electric load from the sub battery thereby occurs.

It is an object of the present invention to detect off-fixation failure of the relay between the main battery and the sub battery.

A control device for a vehicle according to one embodiment includes: a motor generator mechanically connected to an output shaft of an engine; a first battery electrically connected to the motor generator; a second battery electrically connected to an electric load of the vehicle; a relay adapted to switch whether the first battery and the second battery are to be electrically connected or not by turning the relay on or off; and a relay control unit adapted to turn off the relay during a power operation of the motor generator so as to disconnect an electric connection between the first battery and the second battery, the relay control unit also adapted to turn on the relay during a regenerative operation of the motor generator so as to electrically connect the first battery and the second battery. This control device for the vehicle further includes a relay failure diagnosing unit adapted to determine that the relay is off-fixed in a case where a voltage of the second battery is a predetermined voltage or lower or a charge current of the second battery is a predetermined current or smaller in a state that a command to turn on the relay is outputted during the regenerative operation of the motor generator.

An embodiment of the present invention and advantages of the present invention will be described below in detail with reference to the appending drawings.

DESCRIPTION OF EMBODIMENTS

Figure 1:
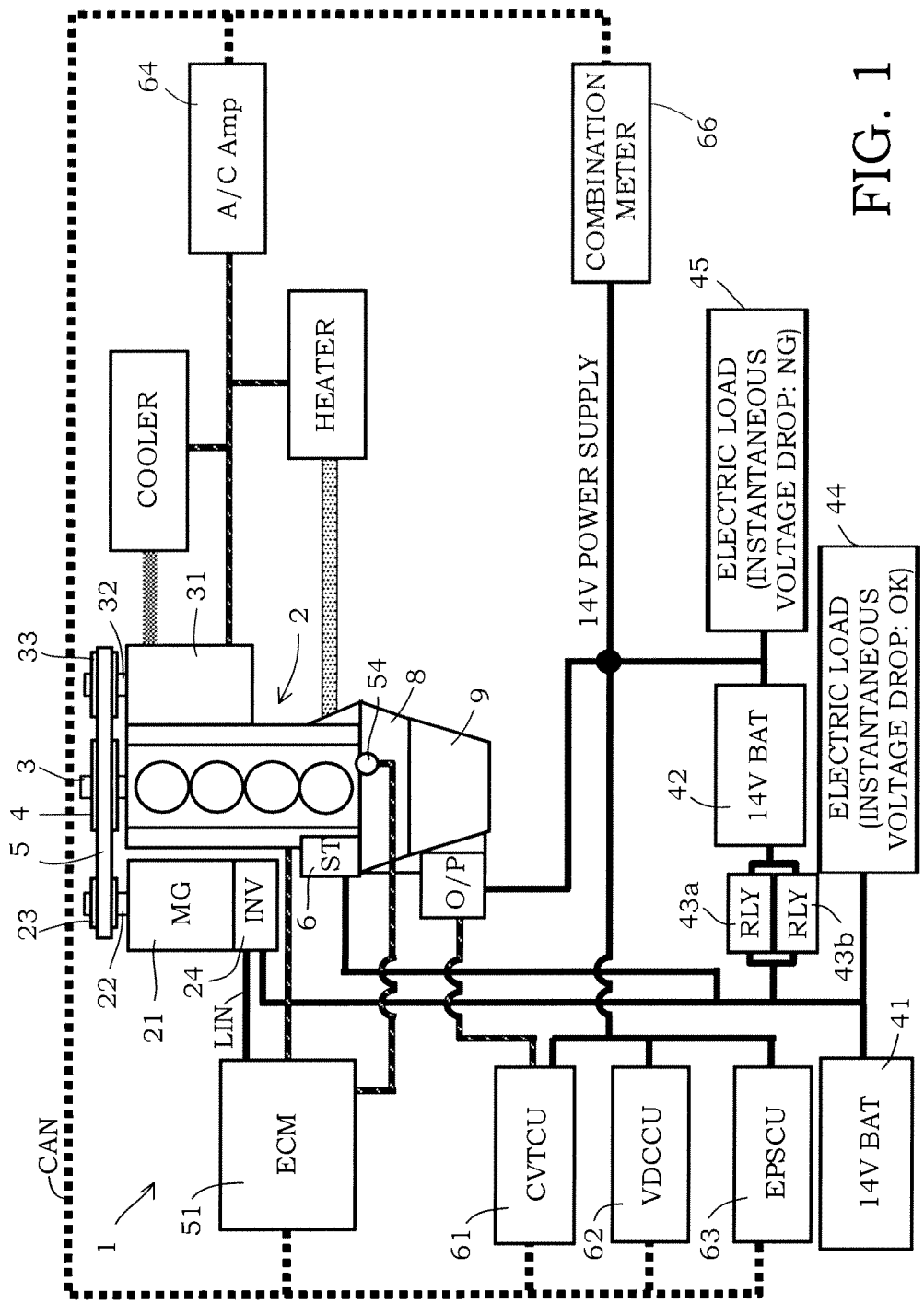
FIG. 1 is a schematic configuration diagram of a control device for a vehicle according to one embodiment.

FIG. 1 is a schematic configuration diagram of a control device for a vehicle according to one embodiment. In FIG. 1, an engine 2, a motor generator 21 and an air-conditioner compressor 31 are provided on a vehicle 1. Specifically, an output shaft 3 of the engine 2, a rotating shaft 22 of the motor generator 21, and a rotating shaft 32 of the air-conditioner compressor 31 are arranged in parallel. A crank pulley 4 is mounted on one end of the output shaft 3, and pulleys 23 and 33 are mounted on the rotating shafts 22 and 32, respectively. A belt 5 is wound around each of these three pulleys 4, 23, and 33, and power is transmitted (conducted) by the belt 5 among the output shaft 3 of the engine 2 and the rotating shafts 22, 32.

A starter 6 is used for start of the engine 2. A torque converter 8 and a belt-type automatic transmission 9 are connected to the other end of the output shaft 3 of the engine 2. The torque converter 8 has a pump impeller and a turbine runner, which are not shown in the drawings. The belt-type automatic transmission 9 has a primary pulley, a secondary pulley, and a steel belt wound around these pulleys, which are not shown in the drawings. A rotary driving force of the engine 2 is finally transmitted to driving wheels of the vehicle (not shown in the drawings) via the torque converter 8 and the automatic transmission 9.

A main battery 41 and a sub battery 42 are provided as a power source of the vehicle 1. Both the batteries are 14V batteries. Two relays 43a and 43b arranged in parallel are connected between the two batteries 41 and 42. Providing the two relays 43a and 43b is because of backup in a case where one of the relays fails and because the number of times of durable operations of the relay is extended as compared with a case in which only one relay is provided.

The starter 6 and the motor generator 21 described above are connected between the main battery 41 and the relays 43a and 43b, and power is supplied from the main battery 41. In this regard, since the motor generator 21 is constituted by an AC machine, an inverter 24 for converting a DC from the main battery 41 into an AC is attached.

An electric load 44 is a load whose own operation is not affected by instantaneous voltage drop in which a voltage of the battery instantaneously drops, and power is supplied from the main battery 41. On the other hand, an electric load 45 is a load whose own operation is affected by the instantaneous voltage drop, and power is supplied from the sub battery 42.

An engine control module (ECM) 51 controls the engine 2, the starter 6, the motor generator 21, and the relays 43a and 43b. For example, the engine control module 51 turns off the relays 43a and 43b during a power operation of the motor generator 21 to disconnect electric connection between the main battery 41 and the sub battery 42. The engine control module 51 turns on the relay 43a or 43b during a regenerative operation of the motor generator 21 to electrically connect the main battery 41 and the sub battery 42. Further, the engine control module 51 diagnoses whether an off-fixation failure of the relay 43a or 43b has occurred or not by means of a method, which will be described later.

Figure 2:
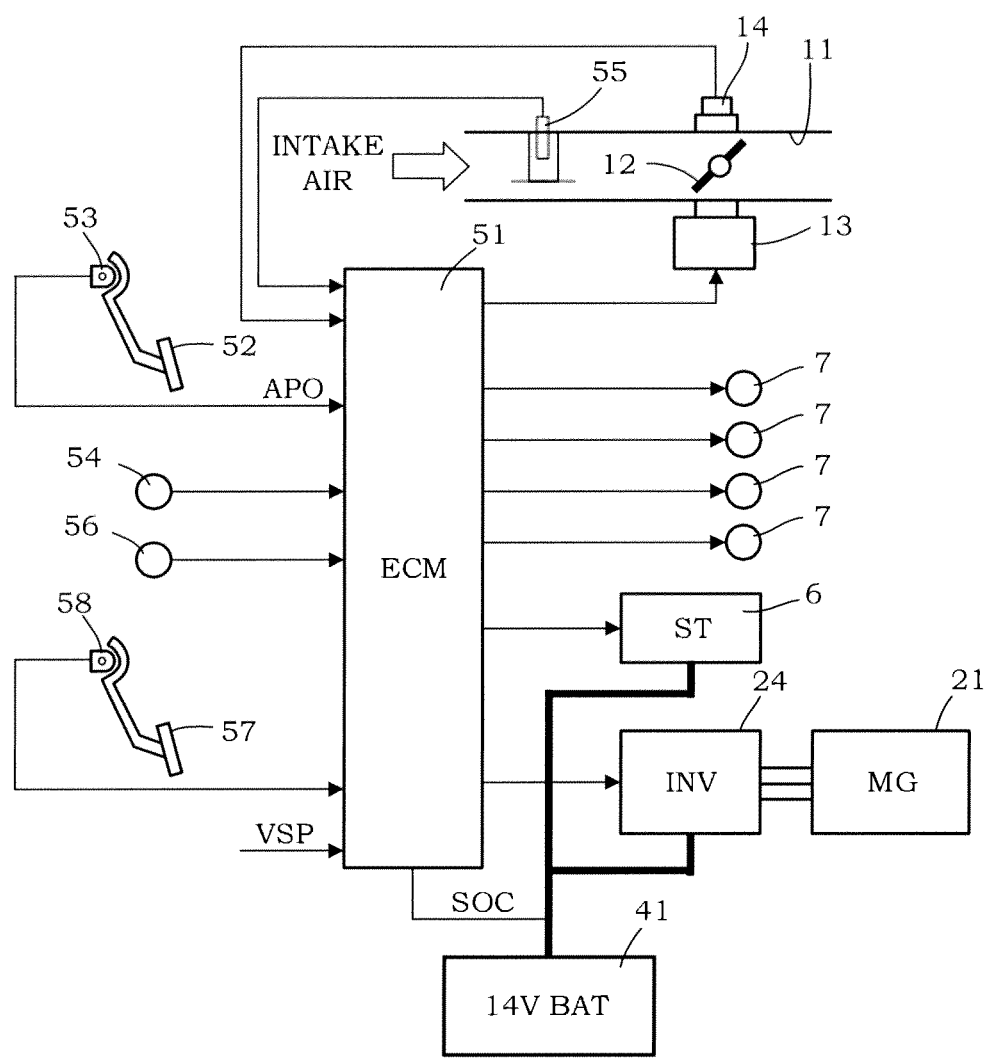
FIG. 2 is a control system diagram of a gasoline engine.

FIG. 2 is a control system diagram of a gasoline engine. A fuel injection valve 7 is provided at each of intake ports (not shown in the drawings). The fuel injection valve 7 intermittently supplies fuel to the engine 2.

An electronically controlled throttle valve 12 is provided on an intake passage 11, and an opening degree of the throttle valve 12 (hereinafter, referred to as a "throttle opening degree") is controlled by a throttle motor 13. An actual throttle opening degree is detected by a throttle sensor 14, and is inputted into the engine control module 51.

A signal of an accelerator opening degree (a stepping amount of an accelerator pedal 52) from an accelerator sensor 53, a signal of a crank angle from a crank angle sensor 54, and a signal of an intake air amount from an airflow meter 55 are inputted into the engine control module 51. A rotation speed of the engine 2 is calculated from the signal of the crank angle sensor 54. The engine control module 51 calculates a target intake air amount and a target fuel injection amount on the basis of these signals, and respectively outputs commands to the throttle motor 13 and each of the fuel injection valves 7 so that the target intake air amount and the target fuel injection amount can be obtained.

Here, a control of the intake air amount will be summarized (see JP9-287513A). By searching a predetermined map from an accelerator opening degree APO and an engine rotation speed Ne, each of a target basic intake air amount and a target equivalent ratio tDML is calculated. A value obtained by dividing the target basic intake air amount by the target equivalent ratio tDML is set to the target intake air amount. Then, by searching a predetermined map from the target intake air amount and the engine rotation speed, a target throttle valve opening degree is acquired. The target throttle valve opening degree is converted into a command value to output the command value to the throttle motor 13.

Next, a control of fuel injection (including a fuel injection amount and fuel injection timing) will be summarized. An output of the airflow meter 55 is A/D converted and linearized to calculate an intake air amount Qa. A basic injection pulse width Tp0 [ms] by which a mixture with a substantially theoretical air fuel ratio (i.e., the equivalent ratio=1.0) can be obtained is acquired from the intake air amount Qa and the engine rotation speed Ne using Tp0=K×Qa/Ne (where K is a constant). Subsequently, a cylinder air amount equivalent pulse width Tp [ms] is acquired by the following formula:

$$Tp = Tp0 \times \text{Fload} + Tp-1 \times (1-\text{Fload})$$

where Fload: weighted average coefficient;
Tp-1: Tp previous time.

Since an amount of air flowing into a cylinder (combustion chamber), that is, a cylinder air amount inheres a response delay with respect to the intake air amount in an airflow meter portion, this response delay is approximated by a primary delay in the formula described above. The weighted average coefficient Fload [absolute number] that is a coefficient of the primary delay is acquired by searching a predetermined map from a product Ne×V of the rotation speed Ne and a cylinder volume V and a total passage area Aa of an intake pipe. On the basis of the cylinder air amount equivalent pulse width Tp acquired in this manner, a fuel injection pulse width Ti [ms] to be given to the fuel injection valves 7 is calculated by the following formula:

$$Ti = Tp \times tDML \times (\alpha + \alpha m - 1) \times 2 + Ts$$

where tDML: target equivalent ratio [absolute number];
α: air fuel ratio feedback correction coefficient [absolute number];
αm: air fuel ratio learning value [absolute number];
Ts: ineffective injection pulse width [absolute number].

Then, at predetermined fuel injection timing, the fuel injection valve 7 is opened for a period of this fuel injection pulse width Ti.

In this regard, the gasoline engine 2 is provided with an ignition plug by facing the combustion chamber (cylinder). The engine control module 51 causes the ignition plug to generate a spark by shutting off an electric current on a primary side of an ignition coil at predetermined timing before a compression top dead center, whereby the mixture in the combustion chamber is ignited.

Further, when the engine control module 51 determines that there is an initial start request on the basis of a signal from a starter switch 56, the engine control module 51 drives the starter 6 to start up the engine 2.

The engine control module 51 carries out an idle stop control with the purpose of improvement of fuel efficiency. Namely, when the accelerator pedal 52 has not been stepped (APO=0), a brake pedal 57 has been stepped (brake switch 58 is turned ON), and the vehicle 1 is in a stop state (vehicle speed VSP=0), an idle stop permission condition is satisfied. When the idle stop permission condition is satisfied, fuel injection from the fuel injection valve 7 to the intake port is shut off, and the engine 2 is stopped. As a result, wasteful fuel consumption is reduced.

Then, in a case where the accelerator pedal 52 is stepped or the brake pedal 57 is returned (the brake switch 58 is turned OFF) in the idle stop state, the idle stop permission condition is not satisfied. In a case where the idle stop permission condition is not satisfied, the engine 2 is subjected to cranking using the motor generator 21 as a starter, and fuel injection from the fuel injection valve 7 and spark ignition by the ignition plug are resumed to restart the engine 2.

By exclusively using the motor generator 21 for restart of the engine from the idle stop in this manner, a use frequency of the starter 6 is reduced, and the starter 6 is thus protected. In this regard, when the starter 6 or the motor generator 21 is to be driven, the engine control module 51 shuts off both the two relays 43a and 43b to electrically disconnect the main battery 41 and the sub battery 42. As a result, it is possible to prevent a voltage of the sub battery 42 from fluctuating with a start operation of the engine 2 is.

Returning to FIG. 1, the explanation will be continued. An automatic transmission control unit (CVTCU) 61 is provided in the vehicle 1. The automatic transmission control unit 61 steplessly controls a gear ratio of the automatic transmission 9 in accordance with a traveling condition of the vehicle determined by the vehicle speed and the throttle opening degree. Further, a mechanical lockup clutch for engaging or disengaging the pump impeller and the turbine runner is provided in the torque converter 8 having the pump impeller and the turbine runner. A traveling region of the vehicle in which the lockup clutch is engaged is determined in advance as a lockup region (having the vehicle speed and the throttle opening degree as parameters). When the traveling condition of the vehicle becomes the lockup region, the automatic transmission control unit 61 engages the lockup clutch to bring the engine 2 and the transmission 9 into a directly connected state. When the traveling condition of the vehicle is not in the lockup region, the automatic transmission control unit 61 disengages the lockup clutch. When the engine 2 and the transmission 9 are brought into the directly connected state, torque is not absorbed by the torque converter 8, and fuel efficiency is improved to that extent.

A vehicle dynamic control (Vehicle Dynamics Control) unit (VDCCU) 62, a vehicle-speed sensitive electric power steering (Electric Power Steering) control unit (EPSCU) 63, an air-conditioner auto amp 64, and a combination meter 66 are also provided in the vehicle 1. In the vehicle dynamic control unit 62, when the vehicle almost laterally sides or swings a tail thereof, a laterally siding state is detected by a sensor, and vehicle stability during traveling is improved by means of a brake control and an engine output control. The vehicle-speed sensitive electric power steering control unit 63 outputs an optimal assist torque signal to an EPS motor on the basis of a steering torque inputted from the torque sensor and the vehicle speed.

The automatic transmission control unit 61, the vehicle dynamic control unit 62, the vehicle-speed sensitive power steering control unit 63, and the combination meter 66 described above are electric loads that cannot allow a voltage drop. Therefore, they are supplied with power from the sub battery 42.

The engine control module 51 and the three control units 61 to 63, the air-conditioner auto amp (A/C amp) 64, and the combination meter 66 are connected to each other by a CAN (Controller Area Network). A vehicle speed signal is inputted into the engine control module 51 from the combination meter 66.

The motor generator 21 is used not only for restart of the engine from the idle stop but also for torque assist during traveling of the vehicle. When the torque assist is allowed, the main battery 41 is used as a power source so as to assist a torque of the engine 2 to cause the motor generator 21 to generate a predetermined assist torque. When the torque assist is prohibited, the motor generator 21 is caused not to generate an assist torque. As a result, it is possible to obtain good acceleration responsiveness (drivability) after start of the engine 2 and after start of the traveling of the vehicle 1.

The inverter 24 and the engine control module 51 are connected to each other by a LIN (Local Interconnect Network). The engine control module 51 instructs, via the LIN, to the inverter 24 whether the motor generator 21 is driven or electric power is generated by the motor generator 21, how much a current is caused to flow for driving the motor generator 21 as a motor, or the like.

Figure 3:
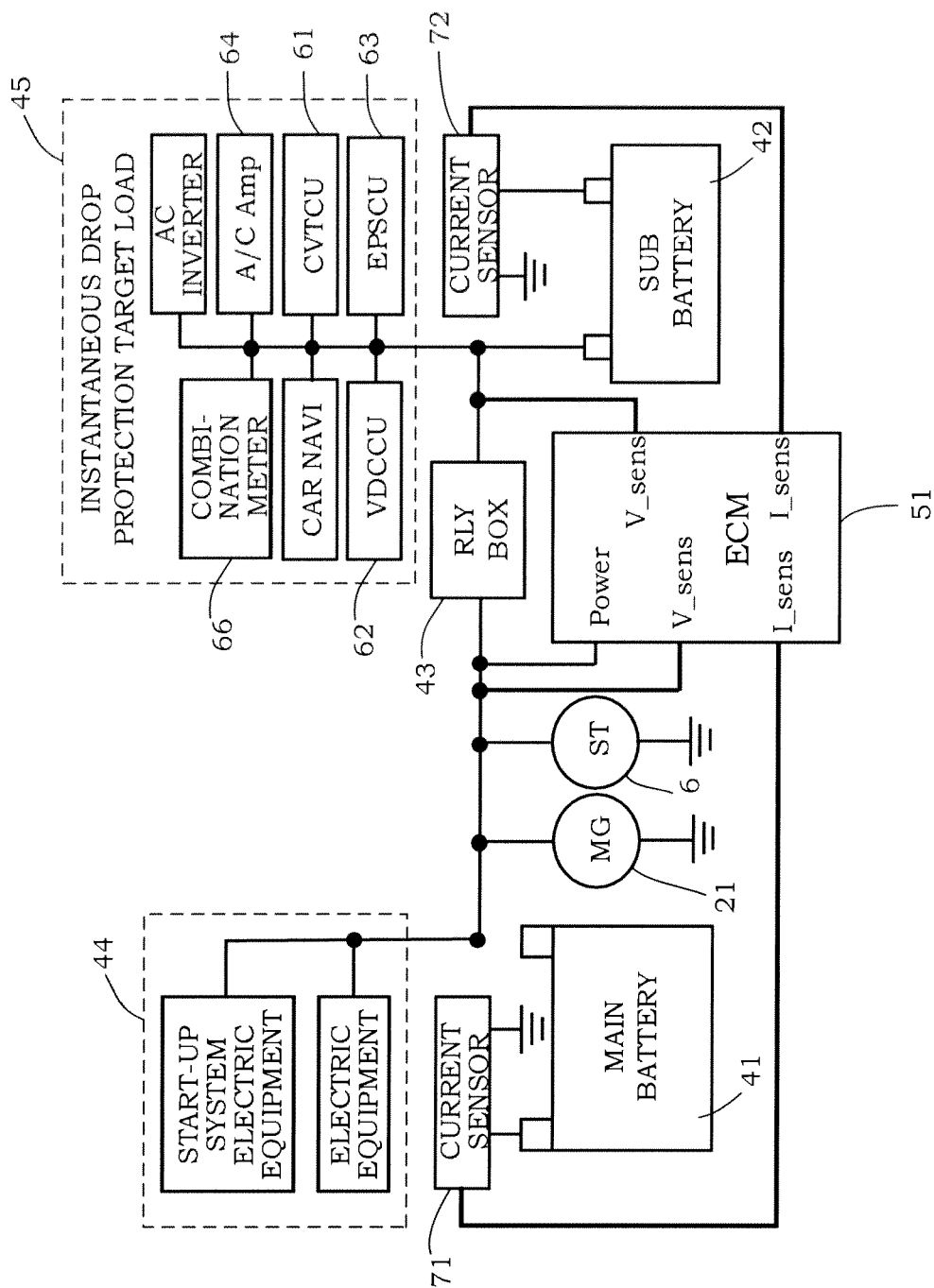
FIG. 3 is a detailed circuit configuration view in which a main battery, a sub battery, a relay box including a relay, and an engine control module are included.

FIG. 3 is a detailed circuit configuration view in which the main battery 41, the sub battery 42, a relay box including the relays 43a and 43b, and the engine control module 51 are included. The engine control module 51 detects a voltage of the main battery 41 and a voltage of the sub battery 42. The engine control module 51 also reads out a charged/discharged current of the main battery 41 detected by a current sensor 71 and a charged/discharged current of the sub battery 42 detected by a current sensor 72. Then, the engine control module 51 calculates an SOC (State of Charge) of the main battery 41 on the basis of the charged/discharged current of the main battery 41 thus read out, and manages a balance of charging/discharging of the main battery 41 on the basis of this SOC. The engine control module 51 also calculates an SOC of the sub battery 42 on the basis of the charged/discharged current of the sub battery 42, and manages a balance of the charging/discharging of the sub battery 42.

The engine control module 51 alternately turns on any one of the relays 43a and 43b when the relays 43a and 43b are turned on in a normal time when an on-fixation failure, in which the relays 43a and 43b continue to be turned on, or an off-fixation failure, in which the relays 43a and 43b continue to be turned off, does not occur. More specifically, both the relays 43a and 43b are turned off during a powering operation of the motor generator 21, while any one of the relays 43a and 43b is turned on during a regenerative operation of the motor generator 21. This makes it possible to consume the relays 43a and 43b uniformly, and it is possible to extend the number of times of durable operations compared with a case where only one relay is provided.

In the control device for the vehicle according to one embodiment, in a state that a command to turn on any one of the relays 43a and 43b is outputted, it is determined that the off-fixation failure in which the relay 43a or 43b, to which the on command has been outputted, is fixed in an off state occurs on the basis of the voltage of the sub battery 42 or a charge/discharge current of the sub battery 42.

Figure 4:
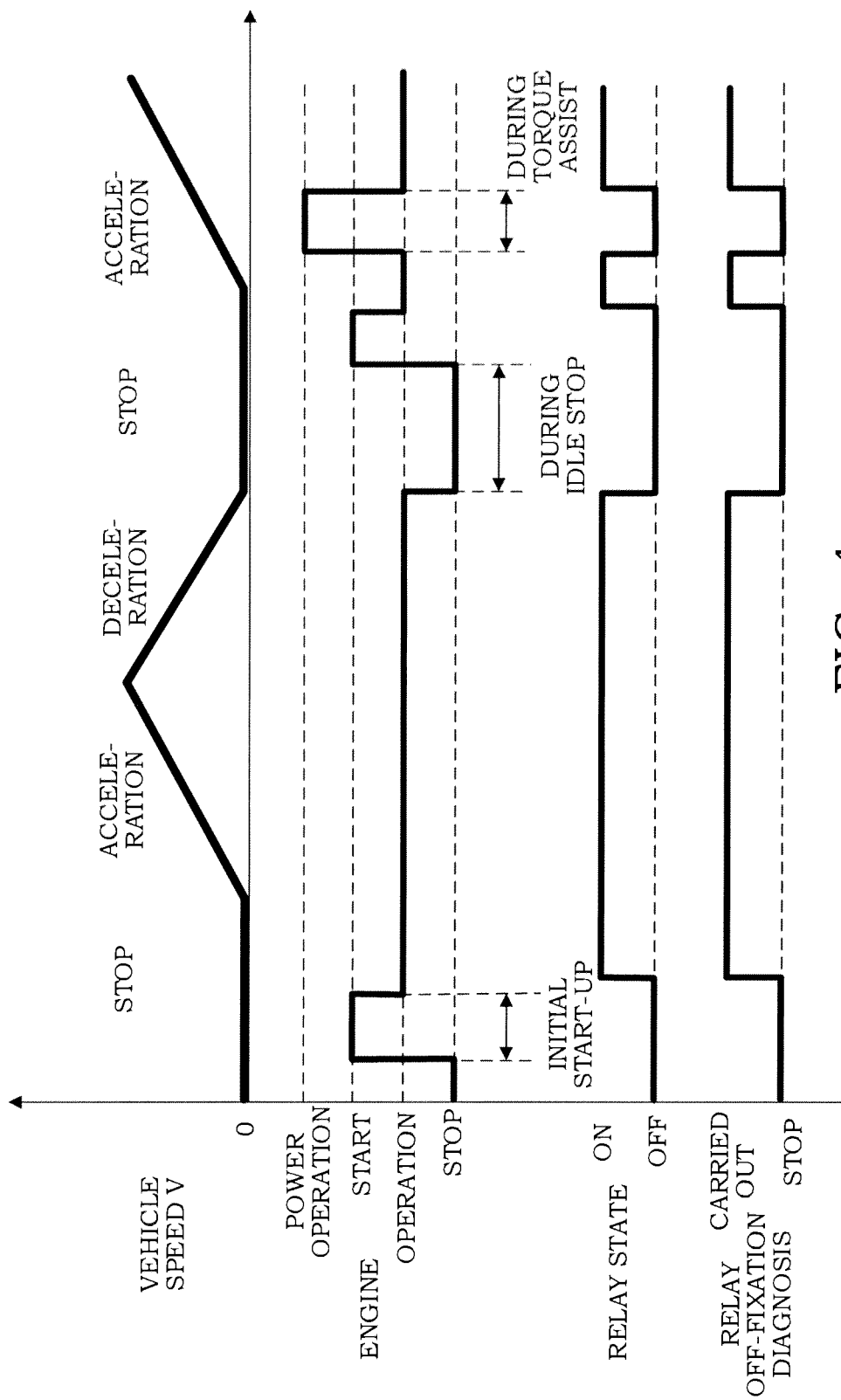
FIG. 4 is a view illustrating timing of diagnosis of relay-off fixation.

FIG. 4 is a view illustrating timing when the relay off-fixation failure is diagnosed. FIG. 4 shows the vehicle speed V, the state of the engine 2, the state of the relays 43a and 43b, and a state of relay off-fixation diagnosis from the upside thereof. As shown in FIG. 4, the relay off-fixation diagnosis is carried out when the command to turn on any one of the relays 43a and 43b is outputted, such as at the time of stop after the initial start of the engine 2, at the time of acceleration or deceleration of the vehicle, after restart from the idle stop and the like.

As described above, any one of the relays 43a and 43b is turned on at the time of the regenerative operation of the motor generator 21, a charge current is supplied to the main battery 41 and the sub battery 42 to charge the main battery 41 and the sub battery 42. In a case where the off-fixation failure has occurred in the relay, to which the on-command has been outputted, at this time, the sub battery 42 cannot be charged, only discharge of the sub battery 42 is carried out, and the voltage thereby keeps on lowering. Therefore, in a case where the voltage of the sub battery 42 lowers to a predetermined voltage or lower or the charge current thereof is a predetermined current or smaller in the state that the command to turn on any one of the relays 43a and 43b has been outputted, it is determined that the relay off-fixation failure has occurred.

The relay off-fixation diagnosis can be carried out by the method described above. However, a lowering degree of the voltage of the sub battery 42 when the relay off-fixation failure has occurred also varies due to an operating current of the electric load 45, a charged state or a deterioration state of the sub battery 42. Therefore, a method of determining that the relay off-fixation failure has occurred in a case where a first condition or a second condition is satisfied in accordance with a voltage difference between the main battery 41 and the sub battery 42 will be described below.

The case where the first condition is satisfied means the case where all of conditions (a) to (c) mentioned below are satisfied:

(a) A command to turn on any one of the relays 43a and 43b has been outputted;

(b) The ignition switch is on; and (c) A first predetermined period of time (25.5 sec., for example) has elapsed in a state that the voltage difference between the main battery 41 and the sub battery 42 is a first predetermined voltage (1.04V, for example) or higher and a discharge current flows from the sub battery 42.

The first predetermined voltage is determined in advance on the basis of the maximum voltage difference V1 between the batteries, which is theoretically generated in a steady state in which a steady current is flowing between the main battery 41 and the sub battery 42. More specifically, the first predetermined voltage is set to a value higher than the maximum voltage difference V1. The maximum voltage difference V1 between the batteries theoretically generated in the steady state in which the steady current is flowing is expressed by the following formula (1). However, a harness resistance value in the formula (1) is a resistance value of a harness between the main battery 41 and the sub battery 42.

The maximum voltage difference V1=a voltage drop inside the relays 43a, 43b+(the harness resistance value×the maximum value of a steady conducted current)+an voltage detection error of the engine control module 51 (1)

In a case where a command to turn on any one of the relays 43a and 43b is outputted in the steady state that the steady current is flowing and the relay to which the command is outputted is turned on, the voltage difference between the main battery 41 and the sub battery 42 does not exceed the maximum voltage difference V1 described above. Namely, in a case where the voltage difference between the main battery 41 and the sub battery 42 is the first predetermined voltage or higher, it can be determined that the relay off-fixation failure has occurred. Here, in order to determine that the relay off-fixation failure has occurred in a state that the voltage difference between the batteries is stably the first predetermined voltage or higher, the first predetermined time is set to a relatively long time (the maximum value that can be set up by the engine control module 51, for example).

On the other hand, the case where the second condition is satisfied is the case where all of the conditions of the (a) and (b) mentioned above and (d) mentioned below are satisfied.

(d) A second predetermined time (100 msec., for example) shorter than the first predetermined time has elapsed in a state that the voltage difference between the main battery 41 and the sub battery 42 is a second predetermined voltage (1.44V, for example), which is higher than the first predetermined voltage, or higher and the discharge current is flowing from the sub battery 42.

The second predetermined voltage is determined in advance on the basis of the maximum voltage difference V2 between the batteries, which is theoretically generated in a state that a transient current flows between the main battery 41 and the sub battery 24. More specifically, the second predetermined voltage is set to a value higher than the maximum voltage difference V2. The maximum voltage difference V2 between the batteries theoretically generated in the state that the transient current flows is expressed by the following formula (2).

The maximum voltage difference V2=the voltage drop inside the relays 43a, 43b+(the harness resistance value×the maximum value of a transient conducted current)+an voltage detection error of the engine control module 51 (2)

In a case where the voltage difference between the main battery 41 and the sub battery 42 is the second predetermined voltage, which is higher than the first predetermined voltage, or higher, it needs to be rapidly determined that the relay off failure has occurred. Therefore, the second predetermined time is set to a value of time as short as possible and with which misdiagnosis should not be carried out due to a slight voltage fluctuation such as a noise.

The first condition and the second condition can be set up by considering a drop in an assist force of the electric power steering, inoperability of the vehicle dynamic control (motor), stop of the assist force of the electric power steering, stop of an operation of a solenoid valve in a CVT, inoperability of the vehicle dynamic control (actuator) and the like, which may occur at the time of the relay off-fixation failure.

As described above, according to the control device for the vehicle in one embodiment, the control device for the vehicle includes: the motor generator 21 mechanically connected to the output shaft of the engine 2; the main battery 41 electrically connected to the motor generator 21, the sub battery 42 electrically connected to the electric load 45 of the vehicle, and the relays 43a and 43b adapted to switch whether the main battery 41 and the sub battery 42 are to be electrically connected or not by turning on/off the relays 43a and 43b themselves. The control device turns off the relays 43a and 43b during the powering operation of the motor generator 21, and turns on the relay 43a or 43b during the regenerative operation of the motor generator 21. In this control device for the vehicle, it is determined that the relay 43a or 43b is off-fixed in a case where the voltage of the sub battery 42 is the predetermined voltage or lower or the charge current of the sub battery 42 is the predetermined current or smaller in the state that the command to turn on the relay 43a or 43b is outputted during the regenerative operation of the motor generator 21. In a case where any one of the relays 43a and 43b is turned on during the regenerative operation of the motor generator 21, the charge current is supplied to the main battery 41 and the sub battery 42 to charge the main battery 41 and the sub battery 42. However, in a case where the off-fixation failure has occurred in the relay to which the on-command has been outputted, the sub battery 42 cannot be charged, only discharge of the sub battery 42 is carried out, and the voltage thereby keeps on lowering. Therefore, in a case where the voltage of the sub battery 42 lowers to the predetermined voltage or lower or the charge current thereof is the predetermined current or smaller during the regenerative operation of the motor generator 21 and in the state that the command to turn on the relay 43a or 43b has been outputted, it is possible to detect occurrence of the relay off-fixation failure reliably.

The present invention is not limited to the embodiment described above, and various variations and applications can be made within a range not departing from the gist of the present invention.

The present application claims priority to Japanese Patent Application No. 2012-167013 filed with Japan Patent Office on Jul. 27, 2012, the content of which is incorporated herein by reference in their entirety.

The invention claimed is:

1. A control device for a vehicle, comprising:
a motor generator mechanically connected to an output shaft of an engine;
a first battery electrically connected to the motor generator;
a second battery electrically connected to an electric load of the vehicle;
a relay configured to switch to cause the first battery and the second battery to be electrically connected or not by turning the relay on or off; and
a controller electrically connected to each of the motor generator, the first battery and second battery, the controller being configured to turn off the relay during a power operation of the motor generator so as to disconnect an electric connection between the first battery and the second battery, the controller being configured to turn on the relay during the regenerative operation of the motor generator so as to electrically connect the first battery and the second battery,
wherein the controller is configured to determine that the relay is fixed in an off state in a case where a voltage of the second battery is a predetermined voltage or lower or a charge current of the second battery is a predetermined current or smaller in a state that a command to turn on the relay is outputted during the regenerative operation of the motor generator.

2. A method of controlling a vehicle, the vehicle comprising:
- a motor generator mechanically connected to an output shaft of an engine;
- a first battery electrically connected to the motor generator;
- a second battery electrically connected to an electric load of the vehicle; and
- a relay configured to switch to cause the first battery and the second battery to be electrically connected or not by turning the relay on or off, wherein the method comprises:

turning off the relay during a power operation of the motor generator so as to disconnect an electric connection between the first battery and the second battery, and turning on the relay during regenerative operation of the motor generator so as to electrically connect the first battery and the second battery; and determining that the relay is fixed in an off state in a case where a voltage of the second battery is a predetermined voltage or lower or a charge current of the second battery is a predetermined current or smaller in a state that a command to turn on the relay is outputted during the regenerative operation of the motor generator.

* * * * *